United States Patent
Kong et al.

(10) Patent No.: US 9,287,124 B2
(45) Date of Patent: Mar. 15, 2016

(54) METHOD OF ETCHING A BORON DOPED CARBON HARDMASK

(71) Applicant: Applied Materials, Inc., Santa Clara, CA (US)

(72) Inventors: Byungkook Kong, San Ramon, CA (US); Jun Wan Kim, San Jose, CA (US); Wonmo Ahn, Fremont, CA (US); Jeong Hyun Yoo, Hwaseong-si (KR); Hun Sang Kim, San Ramon, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 0 days.

(21) Appl. No.: 14/474,841

(22) Filed: Sep. 2, 2014

(65) Prior Publication Data

US 2015/0064914 A1  Mar. 5, 2015

Related U.S. Application Data

(60) Provisional application No. 61/872,456, filed on Aug. 30, 2013.

(51) Int. Cl.
| *H01L 21/302* | (2006.01) |
| *H01L 21/033* | (2006.01) |
| *H01L 21/311* | (2006.01) |
| *H01L 21/683* | (2006.01) |
| *H01J 37/32*  | (2006.01) |

(52) U.S. Cl.
CPC ......... *H01L 21/0332* (2013.01); *H01J 37/3244* (2013.01); *H01J 37/32082* (2013.01); *H01L 21/31122* (2013.01); *H01L 21/6831* (2013.01); *H01J 2237/334* (2013.01)

(58) Field of Classification Search
CPC ............... H01L 21/3065; H01L 21/32136; H01L 21/30621; H01L 21/31138; H01L 21/308; H01L 21/31144; H01L 21/31127
USPC ......... 438/706, 710, 712, 714, 720, 717, 723, 438/725, 736; 216/41, 49, 67
See application file for complete search history.

(56) References Cited

U.S. PATENT DOCUMENTS

| 8,815,752 | B2 * | 8/2014 | Olson et al. | 438/763 |
| 2009/0176375 | A1 * | 7/2009 | Benson et al. | 438/719 |
| 2010/0012922 | A1 * | 1/2010 | Marsh et al. | 257/14 |
| 2013/0109188 | A1 * | 5/2013 | Kim et al. | 438/710 |
| 2013/0146993 | A1 * | 6/2013 | Chang et al. | 257/412 |
| 2013/0323920 | A1 * | 12/2013 | Chang et al. | 438/586 |

* cited by examiner

*Primary Examiner* — Lan Vinh
(74) *Attorney, Agent, or Firm* — Patterson & Sheridan, LLP

(57) ABSTRACT

In one embodiment, a method is proposed for etching a boron dope hardmask layer. The method includes flowing a process gas comprising at least $CH_4$ into a processing chamber. Forming a plasma in the process chamber from the process gas and etching the boron doped hardmask layer in the presence of the plasma. In other embodiments, the process gas utilized to etch the boron doped hardmask layer includes $CH_4$, $Cl_2$, $SF_6$ and $O_2$.

17 Claims, 4 Drawing Sheets

METHOD OF ETCHING A BORON DOPED CARBON HARDMASK

CROSS-REFERENCE TO RELATED APPLICATIONS

This application claims benefit of U.S. Provisional Application Ser. No. 61/872,456, filed Aug. 30, 2013, of which is incorporated by reference in its entirety.

BACKGROUND OF THE DISCLOSURE

1. Field of the Invention

The embodiments herein generally relate to patterning a semiconductor substrate and more particularly, the chemistries used in etching a boron doped hardmask layer.

2. Description of the Background Art

Reliably producing submicron and smaller features is one of the key requirements of very large scale integration (VLSI) and ultra large scale integration (ULSI) of semiconductor devices. However, with the continued miniaturization of circuit technology, the dimensions of the size and pitch of circuit features, such as interconnects, have placed additional demands on processing capabilities. The multilevel interconnects that lie at the heart of this technology require precise imaging and placement of high aspect ratio features, such as vias and other interconnects. Reliable formation of these interconnects is critical to further increases in device and interconnect density.

As device feature sizes become smaller, it has become increasingly more difficult to etch a pattern in the current conventional amorphous carbon hardmask layers without generating defects in the pattern lines formed therein. These pattern line defects in the hardmask layer make it difficult to deep etch high aspect ratio (HAR) features in the underlying dielectric layer while having a good line edge roughness (LER) under the sub 20 nm critical dimensions due to wiggling or roughening of the sidewall in the amorphous carbon hardmask layer.

Conventional hardmask layers include a carbonaceous layer, which consist of an inorganic material comprising at least 20% by weight carbon. Included in this class of materials is amorphous carbon (a-C), typically comprising greater than 50% by weight carbon. While some improvement in HAR etch performance is attained with such carbonaceous masking layers, even greater etch improvements may be provided in boron doped carbonaceous layers. The boron-doped amorphous carbon (a-C:B) results in a layer which has increased resistance to various etchants than previous amorphous carbon hardmask layers. However, the greater resistance of the boron doped carbon hardmask layer to the plasma etches processes call for aggressive etchants that result in poor vertical sidewall profiles when deep etching 20 nm, and smaller, critical dimensions.

Therefore, there is a need for an improved method for etching a boron doped carbon hardmask layers.

SUMMARY OF THE INVENTION

The embodiments herein provide a method for etching a boron doped carbon hardmask layer. In one embodiment, a method for etching a boron doped hardmask layer is provided that includes flowing a process gas comprising at least $CH_4$ into a processing chamber. Forming plasma in the process chamber from the process gas and etching the boron doped hardmask layer in the presence of the plasma.

In another embodiment, a method for etching a boron doped hardmask layer is provided that includes flowing a process gas comprising $CH_4$, $Cl_2$, $SF_6$ and $O_2$ into a processing chamber, forming a plasma in the processing chamber from the process gas, and etching a high aspect ratio feature in the boron doped hardmask layer in the presence of the plasma having a profile angle formed between a sidewall of the high aspect ratio feature and a plane of the opening in the boron doped hardmask layer greater than 89 degrees.

BRIEF DESCRIPTION OF THE DRAWINGS

So that the manner in which the above recited features of the embodiments herein are attained and can be understood in detail, a more particular description of the invention, briefly summarized above, may be had by reference to the embodiments thereof which are illustrated in the appended drawings.

Figure 1:
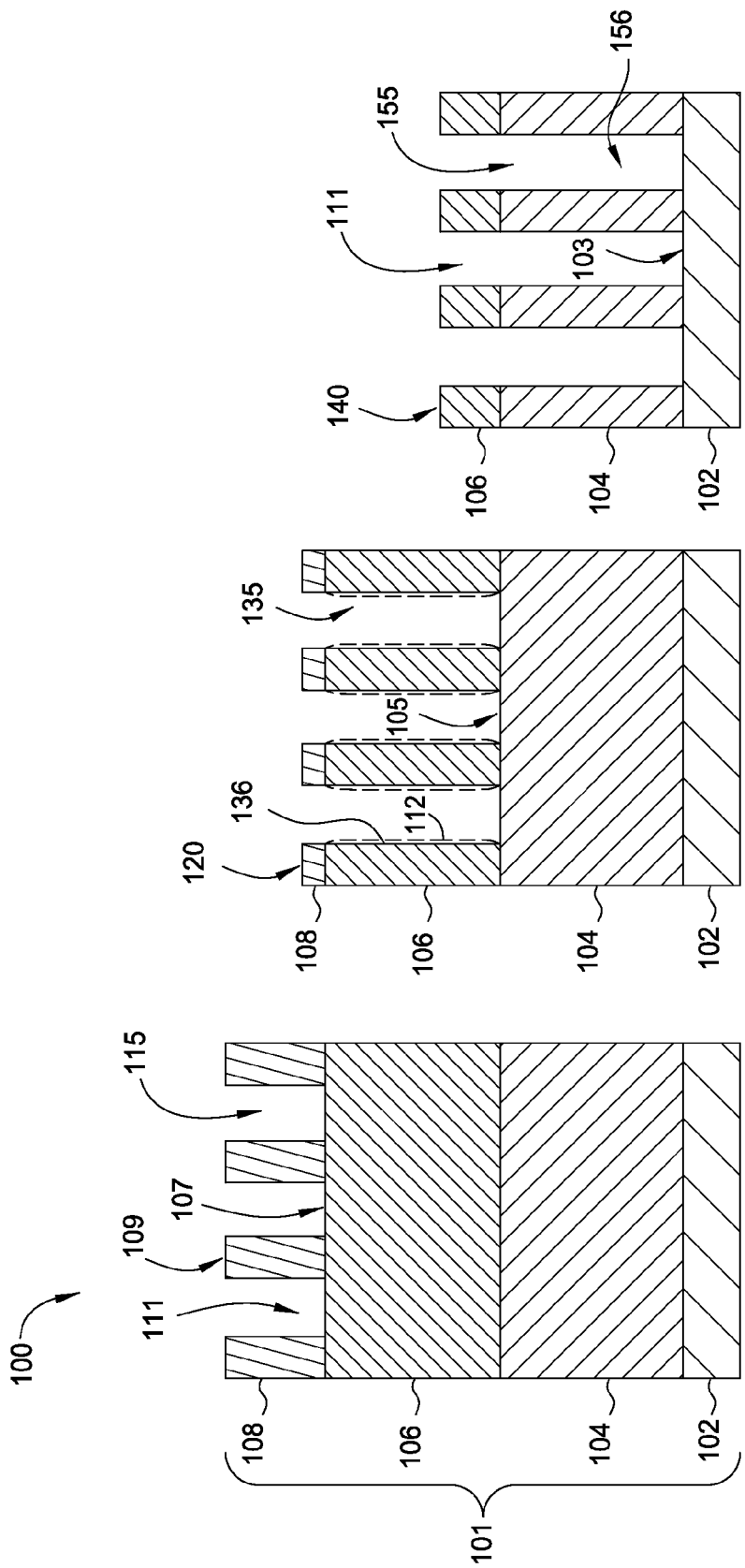
FIGS. 1A-1C depict a sequence for patterning a boron doped hardmask layer.

To facilitate understanding of the embodiments, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

A boron doped hardmask layer, which may include between 1% by weight and 40% by weight boron (B), may be located directly on a semiconductor layer, such as a substrate, and provide a mask thereon for ion implanting or diffusing of dopants into the substrate. The boron doped hardmask layer may also be used in the formation of openings in an underlying deposited film layer. The openings may be used to form interconnects, as well as other features and devices, such as raised gates, capacitors, etc, on the substrate.

The embodiments described herein disclose methods for patterning the boron doped hardmask layer. The boron doped hardmask layer may be used to etch an underlying material for the formation of features with high aspect ratios and/or with small dimensions therein. As discussed herein, high aspect ratio of the features refers to the submicron structures having aspect ratios in excess of 4:1, and small dimensions refer to the submicron structures having dimensions about less than 20 nm. The etching process may include supplying process gases into the processing chamber during an etching process. By adjusting the gas ratio and partial pressure of the gases supplied in the process gas mixture during the etch process of the boron doped hardmask layer, good control of the sidewall vertical edge profile may be obtained for deep, wiggle free, high aspect ratio submicron structures. Wherein a wiggle is a non-planar wavy line or surface.

FIGS. 1A to 1C illustrate a sequence for patterning a boron doped hardmask layer 106 on a substrate 101. The substrate 101 is shown during three separate phases, during the patterning sequence which includes a pre-etch phase illustrated in FIG. 1A, an etch phase illustrated in FIG. 1B and an underlying etch phase illustrated in FIG. 1C. The substrate 101, in the pre-etch phase 110, includes a base layer 102, an underlying layer 104, the boron doped hardmask layer 106, and a masking layer 108. The boron doped hardmask layer 106 is made of boron doped amorphous carbon (a-C:B).

It should be appreciated that prior to the pre-etch phase 110, the substrate 101 may have had additional films and layers underlying the base layer 102 or formed on top of the masking layer 108. For example, an additional masking layer, such as a photo-mask or resist, may be formed on top of the masking layer 108 and used to mask the masking layer 108 to form a pattern of the openings 115 in the masking layer 108 during an etch process.

The masking layer 108 may be hardmask layer such as $SiO_2$, SiN or $SiO_xN_y$, among others. As shown in the pre-etch phase, the masking layer 108 has the pattern of opening 115 already formed therein. The pattern may have been formed in a previous etch process. The etching process forms the opening 115 in the masking layer 108 by removing material from the areas exposed to an etchant. For example, the masking layer 108 may have been etched with tetrafluoromethane $CF_4$, or other suitable gas, to form the opening 115.

The patterned includes areas of masking material 109 around each opening 115. The opening 115 of the masking layer 108 exposes portions 111 of a top surface 107 of the boron doped hardmask layer.

In the etch phase depicted in FIG. 1B, the boron doped hardmask layer 106 may be etched with a plasma formed from a process gas which obtains good vertical profiles for HAR features. Wherein a good vertical profile is defined as critical dimension at the top of the opening 115 divided by the critical dimension of the bottom of the opening 115 is greater than 0.9. Additionally, the angle of the vertical profile for the opening 115, defined between a sidewall 136 and a top surface of the underlying layer 104, may be greater than 89 degrees without bowing. The opening 115 formed in the masking layer 108 are used to pattern the boron doped hardmask layer 106 via an etch process. The etchants impact from process gases, etch the exposed portions 111 of the boron doped hardmask layer 106. After etching the boron doped hardmask layer 106, a pattern of opening 135 is formed in the boron doped hardmask layer 106 which is transferred from the pattern of openings 115 formed in the masking layer 108. The openings 135 have sidewalls 136 and expose a top surface 105 of the underlying layer 104 through the open portions 111.

The process gases, or etchants, which form the pattern of openings 115 in the masking layer 108, are specific to the material being etched. An etchant used to etch a masking layer comprising SiON may be different than an etchant used to etch a boron doped hardmask layer 106 comprising a-C:B. The etchants may be chosen based on the etchants selectivity to a target material. Likewise, the etchants used for etching the masking layer 108, the boron doped hardmask layer 106 and the underlying layer 104 may be chosen based on chemical properties, rates of reactivity, selectivity to the material being etched or other criteria. One such criterion may be an etchant which would lead to good vertical profiles for features with high aspect ratios.

The selectivity of the chosen etchant to a particular material layer may result in multiple etch operations, to be conducted in one or more etch chambers, for each subsequent layers. For example, a first etch chamber may utilize an etchant comprising $H_2$ and $O_2$ for etching the masking layer 108 of the substrate 100. The substrate 100 may then be moved to a second chamber for etching the boron doped hardmask layer 106 with a process gas comprising a mixture of $Cl_2$, $CH_4$, $SF_6$ and $O_2$. The substrate 100 may be moved yet again to a third processing chamber for etching the underlying layer 104 with yet another process gas mixture. Alternatively, a single etch chamber may deliver separate process gas mixtures and chamber parameters through the separate etch operations for each layer.

The boron doped hardmask layer 106 is etched using process gases which may include chlorine ($Cl_2$), methane ($CH_4$), sulfur hexafluoride ($SF_6$), or oxygen ($O_2$), among others. In one embodiment the process gases for etching the boron doped hardmask layer 106 may be a mixture of $Cl_2$, $CH_4$, $SF_6$ and $O_2$. The process gases may remove all but a portion 120 of the masking layer 108 while etching the openings 135 in the boron doped hardmask layer 106 to expose the top surface 105 of the underlying layer 104.

One advantage of the $Cl_2$, $CH_4$, $SF_6$ and $O_2$ process gas is the formation of a polymer coating 112 which protect the exposed sidewalls 136 of the boron doped hardmask layer 106 during the etch process while forming the openings 135. The plasma ions are vertically biased toward the substrate 101 and bombard the exposed horizontal or upward facing surfaces, exposed through the opening 115 in the masking layer 108 for the boron doped hardmask layer 106. The ions biased toward the substrate impact the vertical sidewalls 136 less aggressively while the formed polymer coating 112 protects the sidewalls 136 from the ion bombardment. The resulting pattern of the openings 135 may then be formed in the boron doped hardmask layer 106 with wiggle free (e.g., straighter) vertical sidewalls 136.

The plasma process disassociates the $CH_4$ to from carbon (C) ions and hydrogen (H) ions. The H ions may be evacuated from the processing volume by a pump. C ions may be used for passivation of the boron doped hardmask layer 106. The C ions do not react with the boron doped hardmask layer 106 but instead are available to bond with other ions present in the processing chamber. For example, the C ions may bond with the Cl ions to form a polymer CCl to form the polymer coating 112 on the exposed sidewalls 136 of the boron doped hardmask layer 106. The CCl polymer coating 112 may assist in maintaining the vertical profile of vias or trenches by protecting the sidewalls 136 of the vias or trenches from the etchants which may cause critical dimension loss, wiggling, or other defects. Additionally, C ions may bond with the O ions to form a $CO_x$ gas, for example, carbon dioxide $CO_2$ or carbon monoxide CO. The $CO_x$ gas may then be evacuated from the chamber by a pump.

$Cl_2$ in the process gas may react with other plasma ions and the boron doped hardmask layer 106. $Cl_2$ may react with the H disassociated from the $CH_4$ to form an HCl halogen which may produce a porous surface in the boron doped hardmask layer 106. The porous surface may provide additional passages for radicals to bond with the boron doped hardmask layer 106. However, the H ions preferentially form $H_2$ and the HCl may be minimal. Additionally, the $Cl_2$ may react with the boron in the boron doped hardmask layer 106 forming $BCl_3$ or $B_2Cl_4$.

Cl ions may react with the C ions which may be provided from several sources. The C ions may come from the disassociation of the $CH_4$. Additionally, the C provided for interaction with the Cl ions may be obtained from the material etched from the boron doped hardmask layer 106. The C ions may react with Cl ions, or $Cl_2$, to form a $CCl_4$ polymer coating 112 of the sidewalls 136 or the boron doped hardmask layer 106, which protects the sidewalls 136 to enhance good control of the vertical profile while etching in the boron doped hardmask layer 106 as discussed above.

It is believed the plasma formed from the $Cl_2$, $CH_4$, $SF_6$ and $O_2$ process gas may etch the boron doped hardmask layer 106 predominantly with the ions from the $SF_6$, the $O_2$ and/or the $Cl_2$ gases.

Boron (B) etched from the boron doped hardmask layer 106, reacts with the disassociated $SF_6$ gas to form a boron trifluoride ($BF_3$) or other $BF_x$ byproduct in a volatile state. The formation of the $BF_x$ byproduct permits the removal of the boron etched from the boron doped hardmask layer 106 from the processing chamber by a pump.

Carbon (C) etched from the boron doped hardmask layer 106 reacts with the $O_2$ to form $CO_2$ or some other $CO_x$ compound. The $CO_x$ compounds are in a gaseous state and facilitate the removal of the amorphous-C etched from the boron doped hardmask layer 106 from the processing chamber using the pump. Additionally, carbon ions are present from the disassociation of the $CH_4$ as well as from the CCl polymer formed on the substrate. The carbon from the $CH_4$ and the CCl polymer react with the $O_2$ as well to form a $CO_x$ compound in a gaseous state. The $CO_x$ gas may then be evacuated from the processing chamber by a pump.

Figure 2:
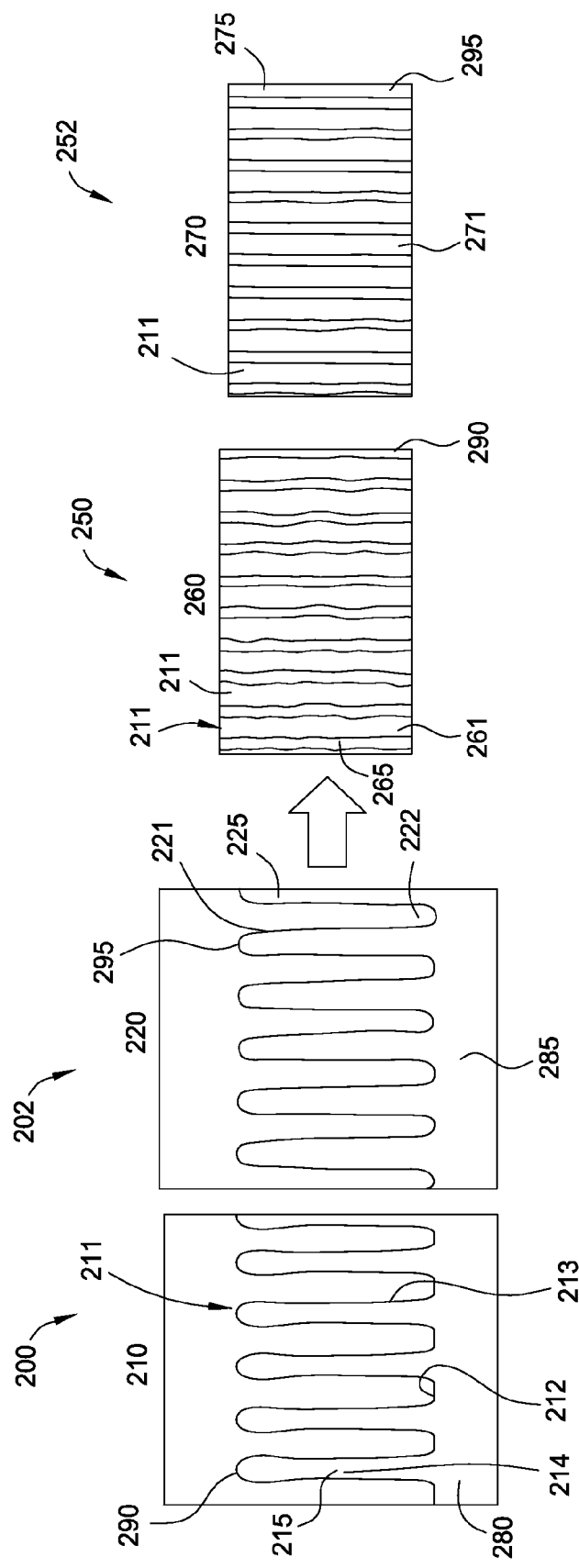
FIG. 2 illustrates a comparison between an etch of an amorphous carbon mask and that of the boron doped mask.

FIG. 2 illustrates a comparison between a conventional amorphous carbon hardmask 210 and the boron doped hardmask 220 etched using $Cl_2$, $CH_4$, $SF_6$ and $O_2$ process gases. The comparisons show a side profile 200 and top down view 250 for an etched conventional amorphous carbon hardmask layer 210 and the side profile 202 and top view 252 for an etched boron doped hardmask layer 220.

The conventional amorphous carbon hardmask 210 has a top surface 290 where the etchant enters the vias 211. The vias 211 have a sidewall 213 and a bottom 212. The bottom 212 is defined by a top surface of the underlying layer. The sidewall 213 have a non-linear profile as can be seen at a location shown with label 215. The sidewall 213 was etched at the location shown with the label 215, narrowing the material 214 between adjacent vias 211. In a subsequent etch operation for an underlying layer, the irregular profile of the sidewall 213 for the conventional amorphous carbon hardmask 210 creates defects in the underlying layer when deep etching 20 nm and smaller critical dimensions. The defects may be cause shorts or make the substrate unusable.

The top down view 250 for the top surface 290 for the conventional amorphous carbon hardmask 210 is shown with the vias 211 forming trenches 261. The top surface 290 has wiggles 265 throughout the length of the top surface 290. The wiggles 265 demonstrate a lack of control for the critical dimensions along the length of the top surface 290. In a subsequent etch operation for an underlying layer, the wiggles 265 will likely create defects in the underlying layer when deep etching features having 20 nm, and smaller, critical dimensions. The defects may also cause shorts or make the substrate unusable.

The boron doped hardmask 220 has a top surface 295 where the etchant enters the vias 221. The vias 221 have a sidewall 225 and a bottom 222. The bottom 222 coincides with a top surface of the underlying layer. The sidewall 225 has a nearly vertical profile from the top surface 295 to the bottom 222. The vertical profile for the sidewall 225 of the boron doped hardmask 220 facilitates deep etching of 20 nm, and smaller, critical dimensions in an underlying layer with little probability of punching through features having thinning of the underlying material which may cause shorts.

The top down view 250 of the top surface 295 for boron doped hardmask 220 is shown with the vias 221 forming trenches 271. The top surface 290 appears linear along the length of the top surface 295. The linear top surface 295 provides control for the critical dimensions along the length of the top surface 290 and facilitates deep etching of features having 20 nm, and smaller, critical dimensions in an underlying layer with little probability of punching through features having thinning of the underlying material which may cause shorts.

Returning back to FIG. 1C, the substrate 101 undergoes an underlying etch phase. In one embodiment, the underlying etch phase illustrated in FIG. 1C may be performed in the same etch chamber as the etch phase illustrated in FIG. 1B. The processing chamber in which the substrate was etched may be evacuated of the etchants utilized in the etch phase. A gas, as part of an intermediary phase, may be introduced into the processing chamber for the purpose of removing the residues left from the etch phase. The intermediary phase may include a post etch treatment gas for neutralizing or stabilizing the substrate surface and the etch chamber from etchants introduced in the previous etch phase. The gas may be evacuated from the processing chamber in preparation of the underlying etch phase performed after the intermediary phase.

Alternatively, the underlying etch phase may be performed in another etch chamber. The substrate 101 may be moved by a robot from the etch chamber, wherein the etch phase occurred, into a second etch chamber for the underlying etch phase after the completion of the etch phase 130. The substrate may be treated prior to the underlying etch phase 150 to remove contamination from previous process.

The underlying etch phase may introduce a process gas suited for etching the underlying layer. The underlying layer 104 may be a metal, dielectric or other substrate layer in which vias, trenches or other high aspect ratio features are formed. The process gas for etching the underlying layer 104 may include a halogen containing gas such as hydrogen bromide (HBr), an oxidizing agent such as $O_2$ or other suitable etchant. The underlying etch phase uses the boron doped hardmask layer 106 to pattern the underlying layer 104. The pattern of the openings 135 is utilized to etch a pattern of the openings 155 in the underlying layer 104. The vertical sidewalls 136 of the opening 135 in conjunction with the vertically biased plasma ions allow for a good pattern transfer when forming through vias 156 in the underlying layer 104 that expose a base layer 102, such as a silicon wafer or other substrate. The vias 156 have may vertical openings 155 without wall collapse or wiggles (as shown in the top and side views 270 and 252 illustrated in FIG. 2).

After etching the vias 156 in the underlying layer 104, portions 140 of the boron doped hardmask layer 106 may remain. An ashing or other process may be utilized to remove the portions 140 which remain of the boron doped hardmask layer 106. Additionally, a post etch treatment may be performed to passivate the substrate 101. The underlying layer 104 may be ready to have features and structures built thereon.

As discussed above, an advantage in the manufacture of sub 20 nm critical dimension features in a substrate may be obtained from wiggle free vertical wall profiles in the masking layers when etching a substrate. The vertical walls formed in the underlying layers 104 of the substrate 101 particularly benefit from the use of a boron doped hardmask layer 106 with the wiggle free vertical walls 136 forming the openings 135. An exemplary etch process chamber for etching the boron doped hardmask layer 106 is discussed below.

Figure 3:
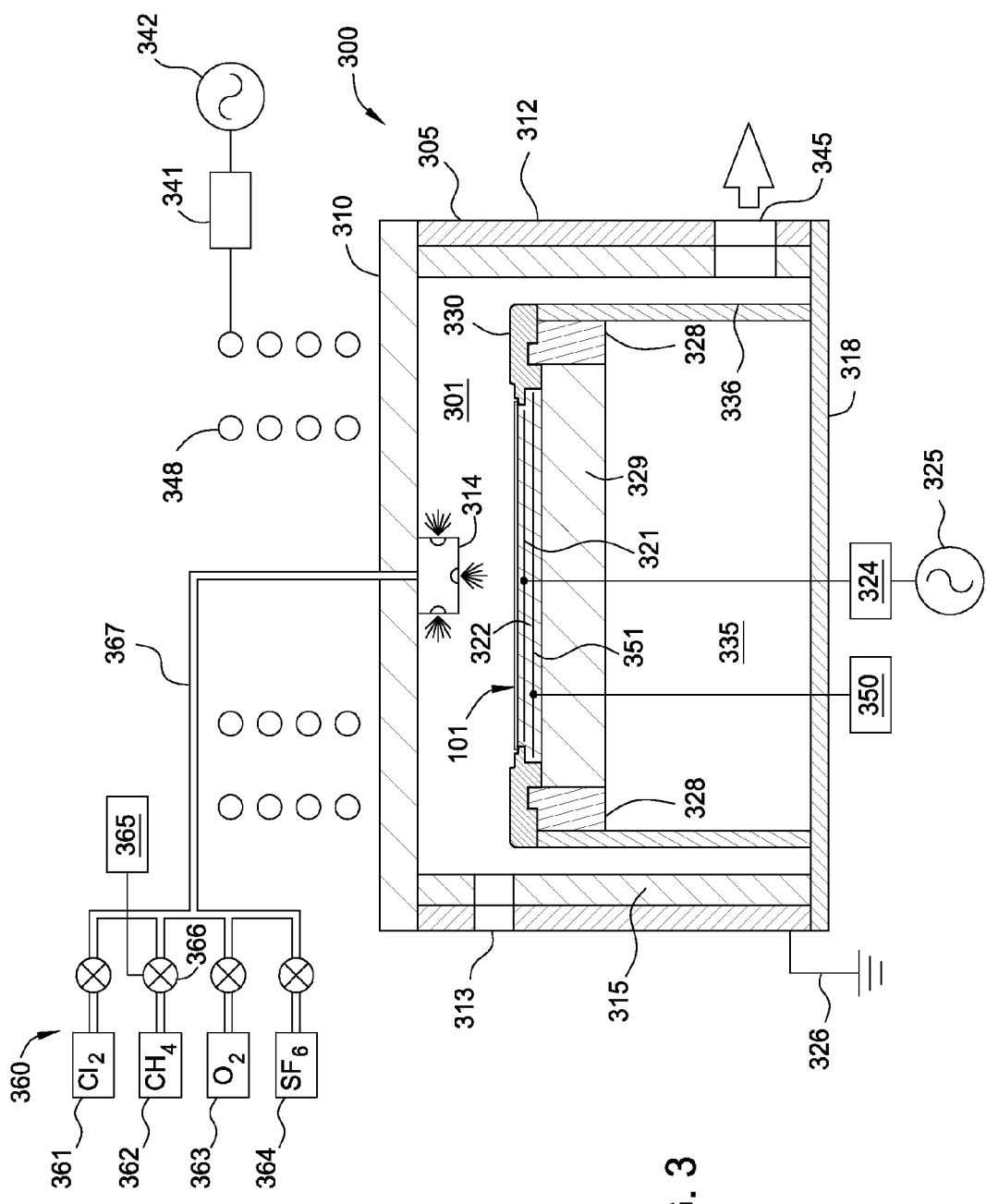
FIG. 3 is a simplified cutaway view for an exemplary etch processing chamber suitable for etching the boron doped hardmask layer.

FIG. 3 is a simplified cutaway view for an exemplary etch processing chamber 300 for etching the boron doped hardmask layer. The exemplary etch processing chamber 300 is suitable for removing one or more film layers from the substrate 101. One example of the process chamber that may be adapted to benefit from the invention is an AdvantEdge Mesa Etch processing chamber, available from Applied Materials, Inc., located in Santa Clara, Calif. It is contemplated that other process chambers, including those from other manufactures, may be adapted to practice embodiments of the invention.

The etch processing chamber 300 includes a chamber body 305 having a chamber volume 301 defined therein. The chamber body 305 has sidewalls 312 and a bottom 318 which are coupled to ground 326. The sidewalls 312 have a liner 315 to protect the sidewalls 312 and extend the time between maintenance cycles of the etch processing chamber 300. The dimensions of the chamber body 305 and related components of the etch processing chamber 300 are not limited and generally are proportionally larger than the size of the substrate 101 to be processed therein. Examples of substrate sizes include 200 mm diameter, 250 mm diameter, 300 mm diameter and 450 mm diameter, among others.

The chamber body 305 supports a chamber lid assembly to enclose the chamber volume 301. The chamber body 305 may be fabricated from aluminum or other suitable materials. A substrate access port 313 is formed through the sidewall 312 of the chamber body 305, facilitating the transfer of the substrate 101 into and out of the etch processing chamber 300. The access port 313 may be coupled to a transfer chamber and/or other chambers of a substrate processing system (not shown).

A pumping port 345 is formed through the sidewall 312 of the chamber body 305 and connected to the chamber volume 301. A pumping device (not shown) is coupled through the pumping port 345 to the chamber volume 301 to evacuate and control the pressure therein. The pumping device may include one or more pumps and throttle valves.

A gas panel 360 is coupled by a gas line 367 to the chamber body 305 to supply process gases into the chamber volume 301. The gas panel 360 may include one or more process gas sources 361, 362, 363, 364 and may additionally include inert gases, non-reactive gases, and reactive gases, if desired. Examples of process gases that may be provided by the gas panel 360 include, but are not limited to, sulfur hexafluoride ($SF_6$), carbon tetrafluoride ($CF_4$), hydrogen bromide (HBr), methane ($CH_4$), argon gas (Ar), chlorine ($Cl_2$), nitrogen (N2), and oxygen gas ($O_2$). Additionally, process gasses may include chlorine, fluorine, oxygen and hydrogen containing gases such as $BCl_3$, $C_4F_8$, $C_4F_6$, $CHF_3$, $CH_2F_2$, $CH_3F$, $NF_3$, $CO_2$, $SO_2$, CO, and $H_2$ among others.

Valves 366 control the flow of the process gases from the sources 361, 362, 363, 364 from the gas panel 360 and are managed by a controller 365. The flow of the gases supplied to the chamber body 305 from the gas panel 360 may include combinations of the gases. For instance, the process gases HBr and $O_2$ may be supplied into the processing volume to etch an aluminum (Al) containing layer disposed on the substrate 101. In one embodiment, the gas panel 360 provides the process gases $Cl_2$, $CH_4$, $SF_6$ and $O_2$ into the chamber body 305 for etching a boron doped hardmask layer 106 disposed on the of the substrate 101.

The gas panel 360 may also provide process gases for other operations such as in-situ post etch treatment (PET). For example, the gas panel 360 may provide the process gases $O_2$ and $N_2$, or Ar and $O_2$, among others, for post etch treatment of the substrate 101. The different ingredients comprising the PET recipe may be tailored for the different etchants used in the etch processing chamber 300. In one embodiment, halogen abatement may be performed in-situ with the combination of oxygen ($O_2$) and hydrogen (H)-containing PET. Meanwhile, chlorine (Cl) abatement may be performed in-situ with the oxygen ($O_2$) and hydrogen (H)-containing PET gases.

The lid assembly 310 may include a nozzle 314. The nozzle 314 has one or more ports for introducing the process gases from the sources 361, 362, 364, 363 of the gas panel 360 into the chamber volume 301. After the process gases are introduced into the etch processing chamber 300, the gases are energized to form plasma. An antenna 348, such as one or more inductor coils, may be provided adjacent to the etch processing chamber 300. An antenna power supply 342 may power the antenna 348 through a match circuit 341 to inductively couple energy, such as RF energy, to the process gas to maintain a plasma formed from the process gas in the chamber volume 301 of the etch processing chamber 300. Alternatively, or in addition to the antenna power supply 342, process electrodes below the substrate 101 and/or above the substrate 101 may be used to capacitively couple RF power to the process gases to maintain the plasma within the chamber volume 301. The operation of the power supply 342 may be controlled by a controller, such as controller 365, that also controls the operation of other components in the etch processing chamber 300.

A substrate support pedestal 335 is disposed in the chamber volume 301 to support the substrate 101 during processing. The support pedestal 335 may include an electro-static chuck 322 for holding the substrate 101 during processing. The electro-static chuck (ESC) 322 uses the electro-static attraction to hold the substrate 101 to the substrate support pedestal 335. The ESC 322 is powered by an RF power supply 325 integrated with a match circuit 324. The ESC 322 comprises an electrode 321 embedded within a dielectric body. The RF power supply 325 may provide a RF chucking voltage of about 200 volts to about 2000 volts to the electrode 321. The RF power supply 325 may also include a system controller for controlling the operation of the electrode 321 by directing a DC current to the electrode 321 for chucking and dechucking the substrate 101.

The ESC 322 may also include an electrode 351 deposed therein. The electrode 351 is coupled to a power source 350 and provides a bias which attracts plasma ions, formed by the process gases in the chamber volume 301, to the ESC 322 and substrate 101 positioned thereon. The power source 350 may cycle on and off, or pulse, during processing of the substrate 101. The ESC 322 has an isolator 328 for the purpose of making the sidewall of the ESC 322 less attractive to the plasma to prolong the maintenance life cycle of the ESC 322. Additionally, the substrate support pedestal 335 may have a cathode liner 336 to protect the sidewalls of the substrate support pedestal 335 from the plasma gases and to extend the time between maintenance of the plasma processing etch processing chamber 300.

The ESC 322 may include heaters disposed therein and connected to a power source (not shown), for heating the substrate, while a cooling base 329 supporting the ESC 322 may include conduits for circulating a heat transfer fluid to maintain a temperature of the ESC 322 and substrate 101 disposed thereon. The ESC 322 is configured to perform in the temperature range required by the thermal budget of the device being fabricated on the substrate 101. For example, the ESC 322 may be configured to maintain the substrate 101 at a temperature of about minus about 25 degrees Celsius to about 500 degrees Celsius for certain embodiments.

The cooling base 329 is provided to assist in controlling the temperature of the substrate 101. To mitigate process drift and time, the temperature of the substrate 101 may be maintained substantially constant by the cooling base 329 throughout the time the substrate 101 is in the etch chamber. In one embodiment, the temperature of the substrate 101 is maintained throughout subsequent etch processes at about 90 degrees Celsius.

A cover ring 330 is disposed on the ESC 322 and along the periphery of the substrate support pedestal 335. The cover ring 330 is configured to confine etching gases to a desired portion of the exposed top surface of the substrate 101, while shielding the top surface of the substrate support pedestal 335 from the plasma environment inside the etch processing chamber 300. Lift pins (not shown) are selectively moved through the substrate support pedestal 335 to lift the substrate 101 above the substrate support pedestal 335 to facilitate access to the substrate 101 by a transfer robot (not shown) or other suitable transfer mechanism.

The controller 365 may be utilized to control the process sequence, regulating the gas flows from the gas panel 360 into the etch processing chamber 300 and other process parameters. Software routines, when executed by the CPU, transform the CPU into a specific purpose computer (controller) that controls the etch processing chamber 300 such that the processes are performed in accordance with the present invention. The software routines may also be stored and/or executed by a second controller (not shown) that is collocated with the etch processing chamber 300.

The substrate 101 has various film layers which may include the boron doped hardmask layer. The various film layers may require etch recipes which are unique for the different compositions of the other film layers in the substrate 101. Multilevel interconnects that lie at the heart of the VLSI and ULSI technology may require the fabrication of high aspect ratio features, such as vias and other interconnects. Constructing the multilevel interconnects may require one or more etch recipes to form patterns in the various film layers. These recipes may be performed in a single etch processing chamber or across several etch processing chambers. Each etch processing chamber may be configured to etch with one or more of the etch recipes. In one embodiment, etch processing chamber 300 is configured to at least etch the boron doped hardmask layer. For processing parameters provided herein, the etch processing chamber 300 is configured to process a 300 diameter substrate, i.e., a substrate having a plan area of about 0.0707 m². The process parameters, such as flow and power, may generally be scaled proportionally with the change in the chamber volume or substrate plan area. In one embodiment, the boron doped hardmask layer 106 may be etched while maintaining a vacuum pressure of about 20 mTorr and a temperature of about 90 degrees Celsius. The gas panel 360 provides about 30 sccm (425 sccm/m² of substrate plan area) of $Cl_2$, about 10 sccm (140 sccm/m² of substrate plan area) of $CH_4$, about 10 sccm (140 sccm/m² of substrate plan area) of $SF_6$ and about 30 sccm (425 sccm/m² of substrate plan area) of $O_2$. About 1750 Watts (24,750 Watts/m² of substrate plan area) of RF energy is supplied to the antenna 318 to form a plasma from the $Cl_2$, $CH_4$, $SF_6$ and $O_2$ process gas. Plasma ions, formed from the $Cl_2$, $CH_4$, $SF_6$ and $O_2$ process gases, are biased by the ESC 322 toward the substrate 101 with about 200 Watts (2830 Watts/m² of substrate plan area) of energy applied to the electrode 351 to etch the boron doped hardmask layer 106 of the substrate 101. The opening 135 formed by the etchants in the boron doped hardmask layer 106 have substantially wiggle free vertical walls 136 (as shown in FIG. 2).

Figure 4:
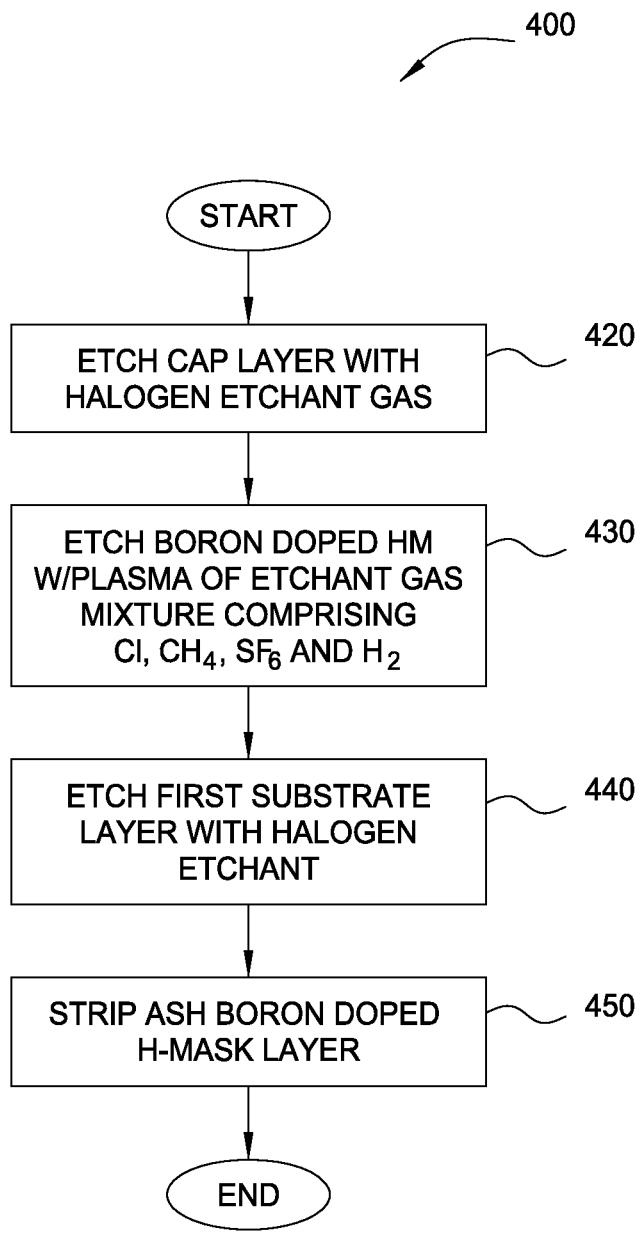
FIG. 4 is a block diagram of a method for etching a substrate using the boron doped hardmask layer in the substrate.

FIG. 4 depicts a method 400 for etching a substrate using a boron doped hardmask layer in the substrate, such as illustrated with reference to the FIGS. 1A to 1C. The method results in a pattern formed in the boron doped hardmask layer with substantially wiggle free vertical walls as illustrated in FIG. 2. The substantially wiggle free vertical walls of the boron doped hardmask layer is used to pattern high aspect ratio deep vias and trenches in an underlying layer. The high aspect ratio deep vias and trenches in the underlying layer are substantially wiggle free and substantially vertical due to the precise profile formed in the boron doped hardmask layer.

The method 400 begins at block 420 where a masking layer 108 is etched. The masking layer has a pattern formed therein by the etchant. The hardmask layer may be etched with a halogen gas. One example of an etchant may be tetrafluoromethane $CF_4$, among others. In one embodiment, the masking layer is $SiO_2$ and is etched with $CF_4$.

Optionally, the resist layer may be stripped prior to etching the boron doped hardmask layer. Additionally, the substrate may be moved to a second etch chamber for etching the boron doped hardmask layer. Alternately, the boron doped hardmask layer may be etched in the same chamber which etched the overlaying masking layer. The chamber and or substrate may undergo a post etch treatment to passivate the substrate and remove trace the etchants and gases utilized in the etching of the masking layer.

At block 430, the boron doped hardmask layer 106 is etched in the etch processing chamber 300 or other suitable chamber. The masking layer, patterned at block 420, provides openings 115 through which etchants, formed from the process gases, can selectively remove material from the exposed portions of the boron doped hardmask layer 106.

In one embodiment, the boron doped hardmask layer 106 may be etched with a process gas mixture that includes at least $CH_4$. In other embodiments, the boron doped hardmask layer 106 may be etched with a process gas mixture that includes a chlorine containing gas, a fluorine containing gas, an oxygen containing gas and a hydrogen containing gas. The gas mixture may include one or more of $Cl_2$, $BCl_3$, $CF_4$, $C_4F_8$, $C_4F_6$, $CHF_3$, $CH_2F_2$, $CH_3F$, $O_2$, $CH_4$, $SF_6$, $NF_3$, $CO_2$, $SO_2$, CO, and $H_2$, among others.

In one embodiment the process gas includes a mixture of $Cl_2$, $CH_4$, $SF_6$ and $O_2$. $Cl_2$ may be provided at a flow rate of between about 0 sccm and about 2150 sccm (about 140 and about 900 sccm/m² of substrate plan area), $CH_4$ provided at a flow rate of between about 0 sccm and about 2150 sccm (about 70 and about 425 sccm/m² of substrate plan area), $SF_6$ provided at a flow rate of between about 0 sccm and about 2150 sccm (about 70 and about 425 sccm/m² of substrate plan area), and $O_2$ provided at a flow rate of between about 0 sccm and about 2150 sccm (about 280 and about 1130 sccm/m² of substrate plan area).

In another embodiment the process gas includes a mixture of $Cl_2$, $CH_4$, $SF_6$ and $O_2$. $Cl_2$ may be provided at a flow rate of between about 10 sccm and about 70 sccm (about 140 and about 900 sccm/m² of substrate plan area), $CH_4$ provided at a flow rate of between about 5 sccm and about 30 sccm (about 70 and about 425 sccm/m² of substrate plan area), $SF_6$ provided at a flow rate of between about 5 sccm and about 30 sccm (about 70 and about 425 sccm/m² of substrate plan area), and $O_2$ provided at a flow rate of between about 20 sccm and about 80 sccm (about 280 and about 1130 sccm/m² of substrate plan area).

In yet another embodiment, $Cl_2$ is provided at a flow rate of between about 10 sccm and about 50 sccm (about 140 and about 705 sccm/m² of substrate plan area), such as about 20 sccm and 30 sccm (about 280 and about 425 sccm/m² of substrate plan area). $CH_4$ is provided at a flow rate of between about 5 sccm and about 20 sccm (about 70 and about 280 sccm/m² of substrate plan area), such as about 5 sccm and about 10 sccm (about 70 and about 140 sccm/m² of substrate plan area). $SF_6$ is provided at a flow rate of between about 5 sccm and about 20 sccm (about 70 and about 280 sccm/m² of substrate plan area), such as about 5 sccm and 10 sccm (about 70 and about 140 sccm/m² of substrate plan area). $O_2$ is provided at a flow rate of between about 20 sccm and about 60 sccm (about 280 and about 850 sccm/m² of substrate plan area), such as about 20 sccm and 40 sccm (about 280 and about 560 sccm/m² of substrate plan area).

During the boron doped hardmask layer 106 etch process, the chamber vacuum pressure may be between about 5 and about 40 mTorr, for example, between about 10 and about 30 mTorr such as between about 15 and about 20 mTorr. The temperature may be between about 60 and about 200 degrees Celsius, for example, between about 10 and about 30 degrees Celsius such as between about 15 and about 25 degrees Celsius. Such pressures and temperatures may be utilized with any of the embodiments described above.

During the boron doped hardmask layer 106 etch process, the RF plasma power provided to the antenna 348 by the power supply 342 to inductively couple energy to the process gas may be in the range of about 200 to 2500 Watts, for example, between about 900 and about 2300 Watts such as between about 15000 and about 2000 Watts. The substrate bias power provided to the pedestal 335 may be between about 100 and about 1000 Watts, for example, between about 100 and about 500 Watts such as between about 100 and about 300 Watts. The bias power may be pulsed. Such plasma and bias power may be utilized with any of the embodiments described above.

In one specific embodiment, the gas source for the processing chamber provides about 30 sccm of $Cl_2$, about 10 sccm of $CH_4$, about 10 sccm of $SF_6$ and about 30 sccm of $O_2$ into the etch chamber for forming a plasma. About 1750 Watts of RF energy is supplied to the $Cl_2$, $CH_4$, $SF_6$ and $O_2$ process gases to form the plasma. The plasma ions, from the disassociated $Cl_2$, $CH_4$, $SF_6$ and $O_2$ process gases, are biased with about 200 Watts of energy applied to the pedestal. The biased plasma ions are directed vertically toward the boron doped hardmask layer of the substrate in order to vertically etch the boron doped hardmask layer. CCl polymers form the coating 112 on the walls of the deep vias to prevent loss of critical dimension control and maintain the vertical profile of the sidewalls 136 of the openings 135 as the F and O etch the boron doped hardmask layer. Upon reaching a layer underlying the boron doped hardmask layer, about 20 seconds, the plasma is stopped.

The pattern formed in the boron doped hardmask layer contains substantially vertical wiggle free high aspect ratio walls. Optionally, the masking layer may be stripped prior to etching the underlying layer. Additionally, the substrate may be moved to a second etch chamber for etching the underlying layer. Alternately, the underlying layer may be etched in the same chamber which etched the boron doped hardmask layer. The chamber and or substrate may undergo a post etch treatment to passivate the substrate and remove trace the etchants and gases utilized in the etching of the masking layer.

At block 440, the underlying layer is etched in the etch processing chamber. The substantially vertical wiggle free high aspect ratio via sidewalls 136 in the boron doped hardmask layer 106 layer provide an improved pattern transfer to the underlying layer 104.

The underlying layer 104 may be metal, dielectric or other substrate layer in which vias, trenches or other high aspect ratio features are formed. The process gas for etching the underlying layer 104 may be selected based on the material composition of the underlying layer 104. The underlying layer 104 is patterned using the boron doped hardmask layer 106. The substantially vertical wiggle free high aspect ratio vias in the boron doped hardmask layer pattern allow through vias to be formed in the underlying layer without wall collapse or wiggles (as shown in FIG. 2).

At block 450, the substrate may be ashed in-situ or ex-situ to remove any remaining masking layers. Additionally, the substrate may have a post etch treatment to passivate the substrate and prepare the substrate for further processing.

Descriptions in this disclosure relate to the methods for etching a hardmask substantially vertical wiggle free high aspect ratio via sidewalls in the boron doped hardmask layer. The substantially vertical wiggle free high aspect ratio via sidewalls in the boron doped hardmask layer provide an improved mask for underlying layers for producing critical dimensions for features, especially for sub 20 nm critical dimensions. The resulting etch of the underlying layer by the improved pattern in the boron doped hardmask layer, produces wiggle free vias with good dimensional control and no wall collapse.

While the foregoing is directed to embodiments of the present invention, other and further embodiments of the invention may be devised without departing from the basic scope thereof, and the scope thereof is determined by the claims that follow:

What is claimed is:

1. A method for etching a boron doped amorphous carbon hardmask layer, comprising:

flowing a process gas comprising $Cl_2$, $CH_4$, $SF_6$, and $O_2$ into a processing chamber;

forming a plasma in the processing chamber from the process gas;

etching the boron doped amorphous carbon hardmask layer in the presence of the plasma; and forming a polymer coating on sidewalls of a feature etched into the boron doped amorphous carbon hardmask layer with the process gas.

2. The method of claim 1, wherein flowing the process gas comprises:

supplying between about 0 and about 2150 sccm/m² of substrate plan area of $Cl_2$ into the processing chamber;

supplying between about 0 and about 2150 sccm/m² of substrate plan area of the $CH_4$ gas into the processing chamber;

supplying between about 0 and about 2150 sccm/m² of substrate plan area of $SF_6$ into the processing chamber; and supplying between about 0 and about 2150 sccm/m² of substrate plan area of $O_2$ into the processing chamber.

3. The method of claim 1, wherein forming the plasma comprises:

providing between 200 Watts and 2500 Watts of RF energy to one or more coils inductively coupled to the plasma.

4. The method of claim 1, wherein etching the boron doped amorphous carbon hardmask layer comprises:

biasing the boron doped amorphous carbon hardmask layer with between 100 Watts and 1000 Watts of RF energy.

5. The method of claim 1, wherein etching the boron doped amorphous carbon hardmask layer comprises:

forming a plurality of vertical features formed through an opening in the boron doped amorphous carbon hardmask layer.

6. The method of claim 5 wherein, the vertical features have a critical dimension and a ratio of the critical dimension for the top of the opening divided by the critical dimension for a bottom of the opening is greater than about 0.9, and a profile angle formed between the a sidewall of the vertical features and a plane of the opening in the boron doped amorphous carbon hardmask layer is greater than 89 degrees.

7. The method of claim 5 further comprising:
ashing a patterned masking layer disposed on top of the boron doped amorphous carbon hardmask layer.

8. The method of claim 7, wherein the ashing of the patterned masking layer is performed in-situ the processing chamber.

9. The method of claim 1 further comprising:
etching an underlying layer deposed beneath the boron doped amorphous carbon hard mask layer in the processing chamber with a second process gas.

10. The method of claim 1, wherein the feature has an aspect ratio of width to depth of less than or equal to about 1:4.

11. The method of claim 10, wherein the feature has a critical dimension and a ratio for the critical dimension of the top of the feature divided by the critical dimension of a bottom of the feature is greater than 0.9, and a profile angle formed between the a sidewall of the feature and a plane of a surface for the boron doped amorphous carbon hardmask layer is greater than 89 degrees.

12. A method for etching a boron doped amorphous carbon hardmask layer, comprising:
flowing a process gas comprising $CH_4$, $Cl_2$, $SF_6$ and $O_2$ into a processing chamber;
forming a plasma in the processing chamber from the process gas;
etching a high aspect ratio feature in the boron doped amorphous carbon hardmask layer in the presence of the plasma having a profile angle formed between a sidewall of the high aspect ratio feature and a plane of the opening in the boron doped amorphous carbon hardmask layer greater than 89 degrees; and
forming a polymer coating on sidewalls of a feature etched into the boron doped amorphous carbon hardmask layer with the process gas.

13. The method of claim 12 wherein flowing the process gas comprises:
supplying between about 0 and about 2150 sccm/m² of substrate plan area of $Cl_2$ into the processing chamber;
supplying between about 0 and about 2150 sccm/m² of substrate plan area of $CH_4$ into the processing chamber;
supplying between about 0 and about 2150 sccm/m² of substrate plan area of $SF_6$ into the processing chamber; and
supplying between about 0 and about 2150 sccm/m² of substrate plan area of $O_2$ into the processing chamber.

14. The method of claim 12 wherein forming the plasma comprises:
providing between 200 Watts and 2500 Watts of RF energy to one or more coils inductively coupled to the plasma; and
biasing the boron doped amorphous carbon hardmask layer with between 100 Watts and 1000 Watts of energy.

15. The method of claim 12, wherein the high aspect ratio feature have a critical dimension and a ratio of the critical dimension for the top of the opening divided by the critical dimension for a bottom of the opening is greater than 0.9.

16. The method of claim 12, wherein the high aspect ratio feature has an aspect ratio of width to depth of less than or equal to about 1:4.

17. The method of claim 10 wherein the high aspect ratio feature has a critical dimension and a ratio for the critical dimension of the top of the feature divided by the critical dimension of a bottom of the feature is greater than 0.9.

* * * * *